Sept. 15, 1953 J. W. KEARNEY ET AL 2,652,539

METHOD AND MEANS FOR WIDE BAND FREQUENCY MODULATION

Filed Nov. 27, 1945

INVENTOR
WILLIAM R. RAMBO
JOSEPH W. KEARNEY
BY
William D. Hall
ATTORNEY

Patented Sept. 15, 1953 2,652,539

UNITED STATES PATENT OFFICE 2,652,539

METHOD AND MEANS FOR WIDE BAND FREQUENCY MODULATION

Joseph W. Kearney, Dorchester, and William R. Rambo, Cambridge, Mass., assignors to the United States of America as represented by the Secretary of War Application November 27, 1945, Serial No. 631,185

12 Claims. (Cl. 332—29)

This invention relates in general to radio apparatus and more particularly to frequency modulated systems.

Conventional frequency modulated systems introduce into the oscillator circuit a reactive element, the value of which is made a function of the modulating voltage. This is usually accomplished by use of reactance tubes or similar apparatus.

It has been demonstrated that the shift in frequency resulting from the insertion of an additional reactance into an oscillator tank circuit is a function of both the magnitude of the reactance and the fraction of the oscillator radio frequency cycle during which it is inserted.

It is an object of this invention to provide a novel method of producing wide band frequency modulation and means for applying such a method.

A further object of this invention is to produce frequency modulation by inserting a reactance of constant value into the oscillator circuit during a selected fraction of the radio frequency cycle.

Other objects, features and advantages of this invention will suggest themselves to those skilled in the art and will become apparent from the following description of the invention taken in connection with the accompanying drawing in which.

This invention employs an actual physical reactance of constant value but whose period of insertion (the fraction of the R. F. cycle) is made a function of the modulating voltage to control the frequency of an oscillator. The required rapid switching is accomplished by a device utilizing an electron tube, the switching period being determined by the time during which the instantaneous switching voltage, a function of both the R. F. and modulating voltages, exceeds a certain arbitrary amplitude.

Figure 1:
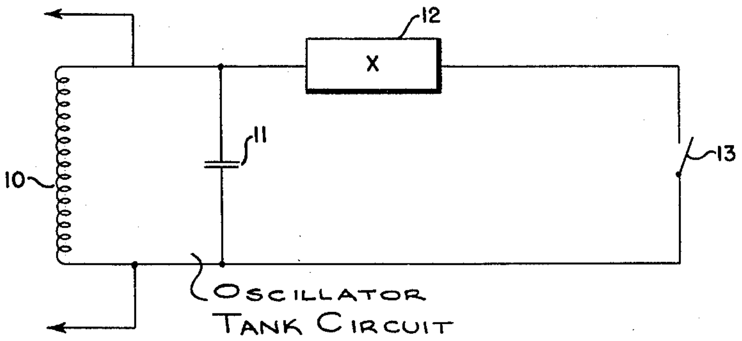
Fig. 1 is a basic diagram indicating certain principles of this invention.

Referring now more particularly to Fig. 1, the basic principle of this invention is illustrated. Inductance 10 and capacitor 11 are connected together to form an oscillator tank circuit. Reactance 12 is connected in series with a switch 13 across said oscillator tank circuit. With switch 13 open the oscillator resonant frequency is:

$$f_0=\frac{1}{2\pi\sqrt{LC}}$$

where L and C respectively indicate the equivalent inductance and capacitance of the oscillator tank circuit as represented in Fig. 1 by inductor 10 and capacitor 11. With switch 13 closed during the entire oscillator cycle, the resonant frequency becomes $f_1$. $f_1$ is greater than $f_0$ if the reactance 12 is inductive and smaller than $f_0$ if the reactance 12 is capacitive.

With switch 13 closed during only part of the oscillator cycle the resonant frequency becomes $f_2$, which has a value between $f_0$ and $f_1$.

Figure 2:
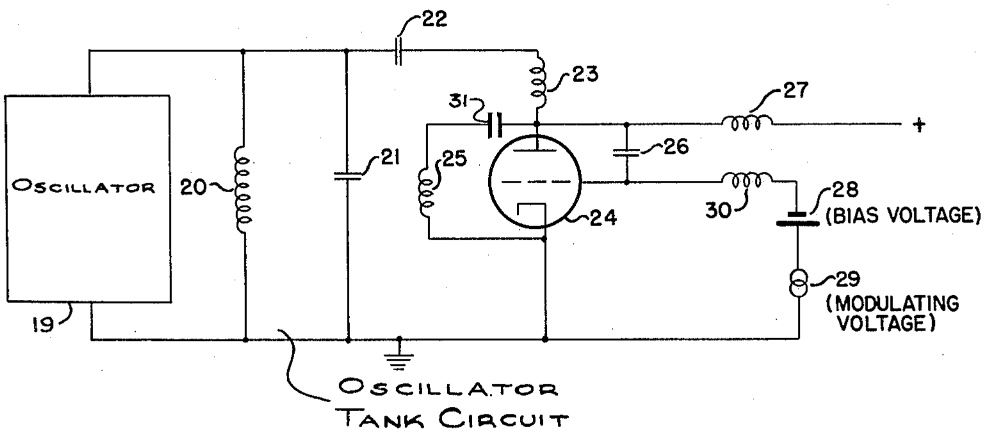
Fig. 2 is a circuit diagram illustrating the essential features of this invention.

Referring now more particularly to Fig. 2, an inductance 20 and capacitor 21 are connected in parallel and represent the tank circuit of a conventional oscillator 19. One side of the aforementioned tank circuit is connected to ground. A capacitor 22 and an inductance 23 are connected in series from the ungrounded side of the tank circuit to the plate of a tube 24. The cathode of said tube 24 is connected to ground. Inductance 25 is connected from the plate of tube 24 to the cathode of tube 24. The grid or tube 24 is connected to the plate of tube 24 through capacitor 26. The plate voltage of tube 24 is supplied through R. F. choke 27. Grid bias voltage source 28 and the modulating voltage source 29 are connected in series with the R. F. choke 30 between the grid and cathode of tube 24.

Capacitor 22 is used as a D.-C. blocking capacitor and prevents the plate voltage of tube 24 from appearing across the tank circuit. The inductance 23 is the reactance of constant value, previously mentioned, which is switched across the tank circuit.

Inductance 25 is used to form a parallel resonant circuit with the tube interelectrode capacitance to prevent a shift in the oscillator frequency when no plate current flows in tube 24. Blocking condenser 31 is used to prevent short circuiting of the plate voltage supply source.

Capacitor 26 is an R. F. bypass capacitor and couples the R. F. voltage from the plate to the grid. Fig. 2 thus represents an oscillator tank circuit in parallel with a series combination of a reactance and an electronic switch.

In operation the R. F. voltage which appears across the tank circuit is applied to the plate of tube 24 through capacitor 22 and inductance 23 and to the grid of tube 24 through capacitor 26. A modulating voltage is applied to the grid of tube 24 through choke 30. The conductivity of tube 24 is thus made a function of the R. F. and modulating voltages. Hence, the period of the R. F. cycle during which the inductance 23 is connected in parallel with the tank circuit is a function of the R. F. and modulating voltages. The frequency of the oscillator will thus be controlled by the modulating voltage.

While there has been described what is at present considered to be the preferred embodiment of this invention, it will be obvious to those skilled in the art that various changes and modifications may be made therein without departing from the scope of the invention.

The invention claimed is:

1. In combination, an oscillation generator having a resonant tank circuit, a reactance means including a reactance and an electronic switch for connecting said reactance in parallel with said tank circuit, and control means including a source of modulation voltage connected to said electronic switch for closing said electronic switch during a fraction of each cycle of said oscillation generator, whereby the resonant frequency of said tank circuit is varied as a function of said fraction of each cycle during which said electronic switch is closed and the said reactance is thereby effectively connected in parallel with said tank circuit.

2. The apparatus defined in claim 1 wherein said reactance is an inductance.

3. The apparatus defined in claim 2 wherein said electronic switch is an electron tube having cathode and anode electrodes, one of said electrodes being connected to one side of said tank circuit and the other of said electrodes being connected to the other side of said tank circuit through said inductance, and means for impressing a positive potential on said anode.

4. The apparatus defined in claim 3 in which said electron tube has a control grid, and means for impressing oscillations from said oscillation generator on said control grid, the magnitude of the modulation voltage and the oscillations impressed on the control grid being such as to render said electron tube conductive during a fraction of each oscillation and non-conductive during the remainder of each oscillation.

5. Apparatus for producing a wide band frequency modulation comprising a radio frequency oscillator having a resonant tank circuit and means for modulating the frequency of the oscillator, said means including a reactance, an electron tube having an anode, cathode, and control grid, said reactance being connected across said tank circuit through the anode cathode space of said electron tube, means for coupling the oscillator to said control grid, means including a source of modulation voltage connected to the control grid for rendering the said electron tube conductive during a fraction of each cycle of the oscillator and varying the said fraction in accordance with the value of the said modulation voltage, whereby the said reactance is effectively connected in parallel with said tank circuit during said fraction of each cycle to thereby vary the frequency of the oscillator in accordance with the modulation voltage.

6. The apparatus defined in claim 5 including means for impressing a positive potential on said anode.

7. Apparatus for producing wide band frequency modulation comprising a radio frequency oscillation generator having a resonant tank circuit and means for modulating the frequency of said oscillation generator, said means including an inductance of constant value, an electron tube having an anode, cathode, and control grid, said inductance being connected across said tank circuit through the anode cathode space of said electron tube, a radio frequency bypass condenser connected between said control grid and anode, means including a source of modulation voltage connected to said control grid for rendering said electron tube conductive during a fraction of each radio frequency oscillation and varying the said fraction in accordance with the value of the said modulation voltage, whereby the said inductance is effectively connected in parallel with said tank circuit during said fraction of each oscillation to thereby vary the frequency of said oscillation generator in accordance with the modulation voltage.

8. The apparatus defined in claim 7 including means for impressing a positive potential on said anode.

9. Apparatus for producing wide band frequency modulation comprising a continuous wave radio frequency oscillator having a resonant tank circuit and means for modulating the frequency of the oscillator, said means including a first inductance, an electron tube having an anode, cathode, and control grid, said first inductance having one terminal connected to one terminal of said tank circuit and having its other terminal connected to the other terminal of said tank circuit through the anode cathode space of said electron tube, means for impressing a positive potential on said anode, a bypass condenser connected between said control grid and anode, a second inductance connected between said anode and cathode and having a value such as to form with the cathode to anode interelectrode capacity a parallel resonant circuit tuned to the frequency of the oscillator, a source of modulation voltage connected to the control grid for rendering the said electron tube conductive during a fraction of each cycle of the oscillator and varying said fraction in accordance with the value of the said modulation voltage, whereby said first inductance is effectively connected in parallel with said tank circuit during said fraction of each cycle to thereby vary the frequency of the oscillator in accordance with the modulation voltage.

10. In a wave-length modulation system, an oscillatory circuit, means for modulating the oscillating current in said circuit comprising a reactor, means for effectively connecting said reactor to said circuit during a first portion of each cycle of said current and for disconnecting said reactor during a second portion of each cycle of said current, and means adapted to be controlled by a source of signals for varying the ratio of said first and second portions as a function of the signal amplitude.

11. A frequency modulation arrangement for converting variable amplitude signals into corresponding frequency-modulated carrier, comprising a variable carrier frequency generator, a tuned oscillatory tank circuit for said generator and including a frequency-determining reactive circuit element which is arranged to be switched into and out of effective relation with said tank circuit, rectifier means connected to said element to effect said switching, and means to control the conductivity of said rectifier means jointly by said signals and by the alternating peak voltage of said tank circuit.

12. A frequency modulating system for an oscillator having a frequency determining circuit, comprising a reactor of constant value, means for periodically connecting said reactor to said circuit during a fraction of each cycle of the oscillating current therein, and means adapted to be controlled by a modulating signal source for varying the magnitude of said fraction as a function of the amplitude of said signal.

JOSEPH W. KEARNEY.
WILLIAM R. RAMBO.

References Cited in the file of this patent

UNITED STATES PATENTS

| Number | Name | Date |
|---|---|---|
| 2,033,231 | Crosby | Mar. 10, 1936 |
| 2,077,223 | Crosby | Apr. 13, 1937 |
| 2,127,486 | Crosby | Aug. 16, 1938 |
| 2,258,470 | Rath | Oct. 7, 1941 |
| 2,291,369 | Boughtwood | July 28, 1942 |
| 2,382,436 | Marble | Aug. 14, 1945 |
| 2,386,566 | Nyquist | Oct. 9, 1945 |
| 2,476,959 | Chatterjea | July 26, 1949 |